(12) United States Patent
Kato et al.

(10) Patent No.: US 8,224,374 B2
(45) Date of Patent: Jul. 17, 2012

(54) WIRELESS TERMINAL DEVICE

(75) Inventors: Hisaya Kato, Souraku-gun (JP); Hiroaki Ozeki, Osaka (JP)

(73) Assignee: Panasonic Corporation, Osaka (JP)

( * ) Notice: Subject to any disclaimer, the term of this patent is extended or adjusted under 35 U.S.C. 154(b) by 1266 days.

(21) Appl. No.: 10/549,496

(22) PCT Filed: Mar. 25, 2004

(86) PCT No.: PCT/JP2004/004183
§ 371 (c)(1),
(2), (4) Date: Mar. 7, 2008

(87) PCT Pub. No.: WO2004/086657
PCT Pub. Date: Oct. 7, 2004

(65) Prior Publication Data
US 2008/0165758 A1    Jul. 10, 2008

(30) Foreign Application Priority Data

Mar. 25, 2003  (JP) ................................. 2003-082402
Nov. 13, 2003  (JP) ................................. 2003-383529

(51) Int. Cl.
*H04B 1/40* (2006.01)
*H04M 1/00* (2006.01)
(52) U.S. Cl. ...................... 455/550.1; 455/77; 455/553.1
(58) Field of Classification Search .................. 455/3.06, 455/77, 550.1, 553.1, 556.2, 132, 137, 168.1, 455/176.1, 188.1, 197.1, 279.1
See application file for complete search history.

(56) References Cited

U.S. PATENT DOCUMENTS

| 6,483,456 | B2 | 11/2002 | Huisken | |
|---|---|---|---|---|
| 6,614,855 | B1 | 9/2003 | Okamoto | |
| 7,106,809 | B2* | 9/2006 | Whikehart et al. | 375/316 |
| 7,327,406 | B2* | 2/2008 | Utsunomiya et al. | 348/731 |
| 7,336,939 | B2* | 2/2008 | Gomez | 455/307 |
| 2002/0010763 | A1 | 1/2002 | Salo et al. | |
| 2004/0176058 | A1* | 9/2004 | Johnson | 455/147 |
| 2005/0188417 | A1* | 8/2005 | Uchida et al. | 725/135 |
| 2007/0274222 | A1* | 11/2007 | Kanno | 370/241 |
| 2007/0287451 | A1* | 12/2007 | Seo et al. | 455/434 |
| 2008/0167069 | A1* | 7/2008 | Bridgelall | 455/553.1 |

FOREIGN PATENT DOCUMENTS

| EP | 1 039 311 A1 | 9/2000 |
|---|---|---|
| JP | 09-219654 | 8/1997 |
| JP | 11-112379 | 4/1999 |
| JP | 11-331002 | 11/1999 |
| WO | 01/08441 A1 | 2/2001 |
| WO | 01/90772 | 11/2001 |

* cited by examiner

Primary Examiner — Andrew Wendell

(57) ABSTRACT

A first switching circuit (21) outputs a first radio signal representing a plurality of time-division multiplexed programs and a second radio signal other than the first radio signal, one at a time according to a switching signal. A voltage control oscillator (27) outputs a local signal at a frequency suitable for whichever signal outputted. Using the local signal generated, a frequency converter (24) frequency converts the first and second radio signals to first and second baseband signals, respectively. Via a second switching circuit (31), a first baseband unit (40) and a second baseband unit (50) are supplied with the first and second baseband signals, respectively, and demodulate them to first and second data signals. A switching unit (60) supplies the switching signal indicating periods during which the first radio signal represents a user-selected program, to a tuner unit (20) where the first and second radio signals are processed by time-sharing.

17 Claims, 8 Drawing Sheets

WIRELESS TERMINAL DEVICE

TECHNICAL FIELD

The present invention relates to a wireless terminal device. More particularly, the present invention relates to a wireless terminal device for receiving a broadcast signal representing a plurality of time-division multiplexed programs to reproduce a user-selected program, and also receiving another radio signal to conduct predetermined processing.

BACKGROUND ART

In recent years, with the growing trend toward digital broadcasting, digital television and radio broadcasting services have been launched throughout the world.

Especially in Europe, DVB-T (Digital Video Broadcasting-Terrestrial) and DAB (Digital Audio Broadcasting) services of transmitting a plurality of programs by time-division multiplexing are already available. In addition, mobile reception of the broadcast with PDAs (Personal Digital Assistances) is under development.

Turning now to the field of communications, more and more AV (Audio Visual) devices are equipped with Bluetooth and wireless LAN (Local Area Network) capabilities, and wireless communication services, such as mobile phones and wireless access to the Internet, have reached the stage of practical use.

In view of the circumstances, AV devices, mobile phones, PDAs each applicable to both broadcast reception and wireless communications have been suggested aiming to offer convenience to users.

As one example of such a device, JP patent application publication No. 11-112379 discloses a wireless communication device having a double function of a radio broadcast receiver and a radio telephone.

FIG. 8 is a functional block diagram showing a main part of the above wireless communication device. When the wireless communication device acts as a radio telephone, a communication signal received with an antenna 901 is converted to an audio signal through the processing conducted by an RF (Radio Frequency) unit 902 for radio telephone system, a TDMA (Time Division Multiple Access) unit 903, and an audio CODEC (COder and DECoder) 904. The audio signal is outputted as sound from a speaker 905. Also, an audio signal picked up by a microphone 909 and selected by a switch 910 is converted to a communication signal through the processing conducted by the audio CODEC 904, the TDMA unit 903, and the RF unit 902. The communication signal is transmitted from the antenna 901.

On the other hand, when the wireless communication device acts as a radio broadcast receiver, a broadcast signal received with an antenna 907 is converted to an audio signal by a radio broadcast receiver 908, and passed sequentially to the switch 910, the audio CODEC 904, and the speaker 905 where the audio signal is outputted as sound.

The above wireless communication device, however, has problems as follows. To receive a communication signal and a broadcast signal which are of different frequencies, the wireless communication device performs frequency conversion using two different local signals that are separately generated by the RF unit 902 and the radio broadcast receiver 908. With this structure, the two local signals interfere with each other, and the interference impairs the noise margin, operational stability, and adjustability of the device.

Further, there is another problem. Provision of two sets of a local oscillator and a frequency converter for generating respective local signals makes it difficult to reduce the device size.

The problems noted herein are inevitable if the above structure is applied as it is to a wireless communication device for handling, for example, the DVB-T service and radio communication service.

DISCLOSURE OF THE INVENTION

To address the above problems, a first object of the present invention is to provide technology for avoiding problems caused by interference of two different local signals in a wireless terminal device. The wireless terminal device is for receiving a broadcast signal in which a plurality of programs are time-division multiplexed to reproduce a user-selected one of the programs as well as for receiving another radio signal to conduct predetermined processing.

Further, a second object of the present invention is to realize a compact implementation of such a wireless terminal device.

To achieve the objects stated above, in one aspect of the present invention, a wireless terminal device is for (i) receiving a first radio signal relating to a first service which is a broadcasting service, and a second radio signal relating to a second service, the first radio signal representing a plurality of time-division multiplexed programs as well as periods during which the respective programs are represented, and (ii) performing reproduction of one of the programs selected by a user, and predetermined processing based on the second radio signal. The wireless terminal device comprises: a tuner unit operable to generate a first baseband signal and a second baseband signal one at a time according to a switching signal, the first baseband signal being generated by frequency converting the received first radio signal and the second baseband signal being generated by frequency converting the received second radio signal; a first baseband unit operable to demodulate the first baseband signal to a first data signal; a second base band unit operable to demodulate the second baseband signal to a second data signal; and a switching unit operable to identify, with reference to the first data signal, a period during which the first radio signal representing the selected program is received, and control the tuner unit by outputting thereto the switching signal indicating a first period that includes the identified period, so that the tuner unit generates the first baseband signal during the first period and the second baseband signal during a second period that is a period other than the first period. The wireless terminal device reproduces the selected program from the first data signal, and conducts the predetermined processing using the second data signal.

Here, the tuner unit may include a local oscillator operable to generate a local signal at (i) a first frequency during the first period for use in the generation of the first baseband signal and (ii) a second frequency during the second period for use in the generation of the second baseband signal, according to the switching signal. The tuner unit may generate, using the local signal, the first and second baseband signals by frequency converting the first and second radio signals, respectively.

Here, the wireless terminal device may further comprise: a first antenna having a selective gain to the first radio signal, and operable to output a received signal to the tuner unit; and a second antenna having a selective gain to the second radio signal, and operable to output a received signal to the tuner unit. The tuner unit may include a switching subunit operable to select one of the signal received by the first antenna during the first period and the signal received by the second antenna during the second period, according to the switching signal. The tuner unit may generate the first baseband signal and the second baseband signal both by frequency converting the signal selected by the switching subunit.

Here, the tuner unit may include a variable bandpass filter operable to exclusively pass, according to the switching signal, the first radio signal during the first period and the second radio signal during the second period, out of a reception signal containing the first and the second radio signals. The tuner unit may generate the first baseband signal and the second baseband signal both by frequency converting an output signal of the variable bandpass filter.

Here, the wireless terminal device may display information relating to the predetermined processing according the second radio program, on a display along with the selected program.

Here, the first service may be Digital Video Broadcasting or Digital Audio Broadcasting in Europe.

With the structures stated above, the tuner unit is time-shared for receiving the first and second radio signals during the first and second periods, respectively. Thus, the tuner unit maybe implemented using a single local oscillator. Consequently, two different local signals are never generated concurrently, which eliminates the possibility of harmful interference. In addition, reduction of the size (the occupied area when implemented on an IC chip) and power consumption of the wireless terminal device is realized.

Here, the second service maybe a bidirectional communication service. The second baseband unit may demodulate the second baseband signal to the second data signal, and modulate a third data signal to a third baseband signal. The third data signal is transmission data relating to the second service. The wireless terminal device may further comprise a transmitting unit operable to generate a third radio signal by frequency converting the third baseband signal, and transmit the third radio signal.

Here, the local oscillator may generate the local signal at a third frequency during a transmission period of the bidirectional communication. The transmitting unit may generate the third radio signal by frequency converting the third baseband signal using the local signal of the third frequency.

With the structures stated above, when the second service is a bidirectional communication service, the wireless terminal device is capable of signal transmission.

Here, the tuner unit may include: a first tuner operable to generate a first local signal exclusively during the first period according to the switching signal, and generate the first baseband signal by frequency converting the first radio signal using the first local signal; and a second tuner operable to generate a second local signal exclusively during the second period according to the switching signal, and generate the second baseband signal by frequency converting the second radio signal using the second local signal.

With the structure stated above, the first tuner and the second tuner never operate concurrently, and thus two local signals are never generated concurrently. This eliminates the possibility of harmful interference as well as reducing the power consumption of the wireless terminal device.

Here, the wireless terminal device may further comprise a power-saving unit operable to restrict or stop supply of operating power to (i) the second tuner during the first period and (ii) the first tuner during the second period, according to the switching signal.

Here, the wireless terminal device may further comprise a power-saving unit operable to restrict or stop supply of operating power to (i) the second tuner during the first period and (ii) the first tuner during the second period, according to the switching signal.

With the structures stated above, each unit is made to stop operating during the time in which no useful operations are to be performed, thereby reducing the power consumption of the wireless terminal device.

Here, the first service may be provided by a cellular system in which each of a plurality of base stations provided for a geographic cell transmits the respective first radio signal. The second radio signal may contain positional information for measuring a current position of a receiver device of the second radio signal. The wireless terminal device may periodically measure its own current position based on the received second radio signal. When the measured current position moves from a first cell into a second cell, the wireless terminal device may stop receiving the first radio signal transmitted from a base station of the first cell and commences receiving the first radio signal transmitted from a base station of the second cell.

With the structure stated above, a point where the respective first radio signals of the first and second cells are substantially equal in strength and delay time is determined as a boundary of the cells. The cells for the first radio signal reception are switched at the boundary. With this operation, the first radio signal are started to be received in the second cell without redoing operations that have been performed in the first cell, such as the AGC (Automatic Gain Control) adjustment and reception of synchronization signal for estimating effective symbol periods. This minimizes the possibility that the video and audio are interrupted at the time when the wireless terminal moves across the boundary between cells.

Here, the second radio signal may contain positional information for measuring a current position of a receiver device of the second radio signal. The wireless terminal device may periodically measure its own current position based on the received second radio signal to calculate a moving speed, and receive the first radio signal in one of a plurality of different operating modes that corresponds to the calculated moving speed.

With this structure, the wireless terminal device is allowed to increase the speed of tracking AGC adjustment in the mobile reception mode than in the fixed reception mode, and similarly increase the speed of tracking the correction for signal equalization. As a result, the influence of abrupt fading that often occurs during the mobile reception is reduced.

Here, the wireless terminal device may display information relating to the predetermined processing according the second radio program, on a display along with the selected program.

With the structure stated above, users are provided with the convenience of concurrently viewing the selected program and the information relating to the predetermined processing. For example, while watching a shopping program as the selected program, a user is allowed to place an order via the Internet, which is carried out as the predetermined processing.

In another aspect of the present invention, a single-chip IC or an IC chip set is for use in a wireless terminal device (i) receiving a first radio signal relating to a first service which is a broadcasting service, and a second radio signal relating to a second service, the first radio signal representing a plurality of time-division multiplexed programs as well as periods during which the respective programs are represented, and (ii) performing reproduction of one of the programs selected by a user, and predetermined processing based on the second radio signal. The single-chip IC or the IC chip set comprises: a reception signal obtaining terminal operable to obtain the first and second radio signals received; a tuner circuit operable to generate a first baseband signal and a second baseband signal one at a time according to a switching signal, the first baseband signal being generated by frequency converting the obtained first radio signal and the second baseband signal being generated by frequency converting the obtained second radio signal; a first baseband circuit operable to demodulate the first baseband signal to a first data signal; a second baseband circuit operable to demodulate the second baseband signal to a second data signal; a program selection signal obtaining terminal operable to obtain a signal indicating the selected program; a switching circuit operable to identify, with reference to the first data signal, a period during which the first radio signal representing the selected program is received, and control the tuner circuit by outputting thereto the switching signal indicating a first period that includes the identified period, so that the tuner circuit generates the first baseband signal during the first period and the second baseband signal during a second period that is a period other than the first period; and an output terminal operable to output the first and second data signals.

Here, the tuner circuit may include a local oscillator operable to generate a local signal at (i) a first frequency during the first period for use in the generation of the first baseband signal and (ii) a second frequency during the second period for use in the generation of the second baseband signal, according to the switching signal. The tuner circuit may generate, using the local signal, the first and second baseband signals by frequency converting the first and second radio signals, respectively.

Here, the tuner circuit may include a first tuner operable to generate a first local signal exclusively during the first period according to the switching signal, and generate the first baseband signal by frequency converting the first radio signal using the first local signal; and a second tuner operable to generate a second local signal exclusively during the second period according to the switching signal, and generate the second baseband signal by frequency converting the second radio signal using the second local signal.

With the structures stated above, the single-chip IC or the IC chip set are obtained with the similar effects described above.

BEST MODE FOR CARRYING OUT THE INVENTION

The following describes preferred embodiments of the present invention with reference to the accompanying drawings.

Embodiment 1

A wireless terminal device according to an embodiment 1 of the present invention receives a first radio signal relating to a first service which is a broadcasting service, and a second radio signal relating to a second service which is a position measuring service. The first radio signal represents a plurality of time-division multiplexed broadcast programs as well as periods during which the respective programs are represented. In addition to the reception of the signals, the wireless terminal device reproduces one of the programs selected by a user, and also measures its own current position based on the second radio signal.

The wireless terminal device of this embodiment may be implemented as a portable television receiver, a notebook personal computer, a mobile phone, or a PDA.

(Overall Structure)

Figure 1:
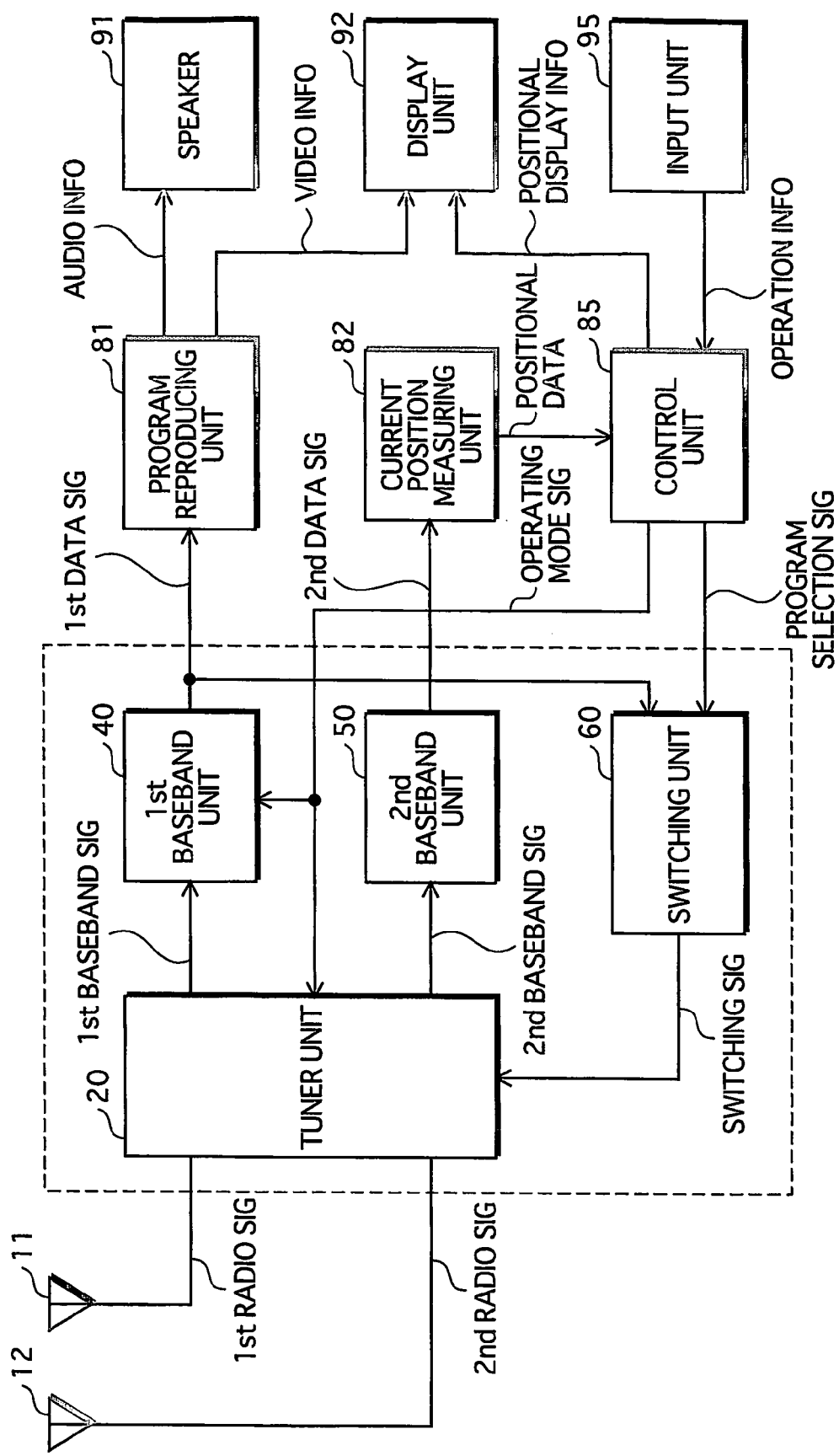
FIG. 1 is a functional block diagram showing the overall structure of a wireless terminal device according to an embodiment 1 of the present invention.

FIG. 1 is a functional block diagram showing the overall structure of the wireless terminal device of the embodiment 1.

A first antenna 11 selectively receives the first radio signal, whereas a second antenna 12 selectively receives the second radio signal. The selectivities of the antennas may be implemented, for example, as their frequency selectivities provided that the first and second radio signals are of different frequencies.

A tuner unit 20 outputs a first baseband signal and a second baseband signal, one at a time according to a switching signal. The first baseband signal is generated by frequency converting the first radio signal, and the second baseband signal is generated by frequency converting the second radio signal. A first baseband unit 40 demodulates the first baseband signal to a first data signal, whereas a second baseband unit 50 demodulates the second baseband signal to a second data signal.

The switching unit 60 identifies periods during which the first radio signal represents the selected program, with reference to the first data signal and a program selection signal that indicates the selected program. Further, the switching unit 60 controls the tuner unit 20 by outputting a switching signal to the tuner unit 20. The switching signal indicates first periods each including one of the identified periods. On receiving the switching signal, the tuner unit 20 is controlled to output the first baseband signal during the first period and the second baseband signal during a second period that is a period other than the first period.

A program reproducing unit 81 reproduces, from the first data signal, audio information and video information of the selected program, and outputs sounds represented by the audio information from a speaker 91 and pictures represented by the video information on a display unit 92.

A current position measuring unit 82 periodically measures a current position of the wireless terminal device with reference to the second data signal, and outputs positional data indicative of the measured position to a control unit 85.

The control unit 85 calculates the moving speed and direction of the wireless terminal device from the positional data, and displays positional display information on the display unit 92 along with the pictures of the selected program. With the display of the positional display information, the user is informed of the current position, moving speed, and moving direction of the wireless terminal device. Further, the control unit 85 outputs an operating mode signal indicative of either a mobile reception mode or a fixed reception mode depending on the calculated moving speed, to the tuner unit 20 and the first baseband unit 40.

An input unit 95 receives user operations selecting a program, and outputs operation information indicative of the user operations to the control unit 85. Based on the operation information, the control unit 85 outputs a program selection signal that indicates the user-selected program to the switching unit 60.

In FIG. 1, the main part of the present invention is enclosed within dashed lines. Among the components of the main part, the tuner unit 20 may be implemented using an analog signal processing circuit, whereas the first baseband unit 40, the second baseband unit 50, and the switching unit 60 may be implemented as digital signal processing functions performed by a DSP (Digital Signal Processor). In this case, the main part may be implemented as a digital-analog hybrid IC or as a chip set composed of an analog IC chip and a digital IC chip.

(Display Examples)

Figure 2:
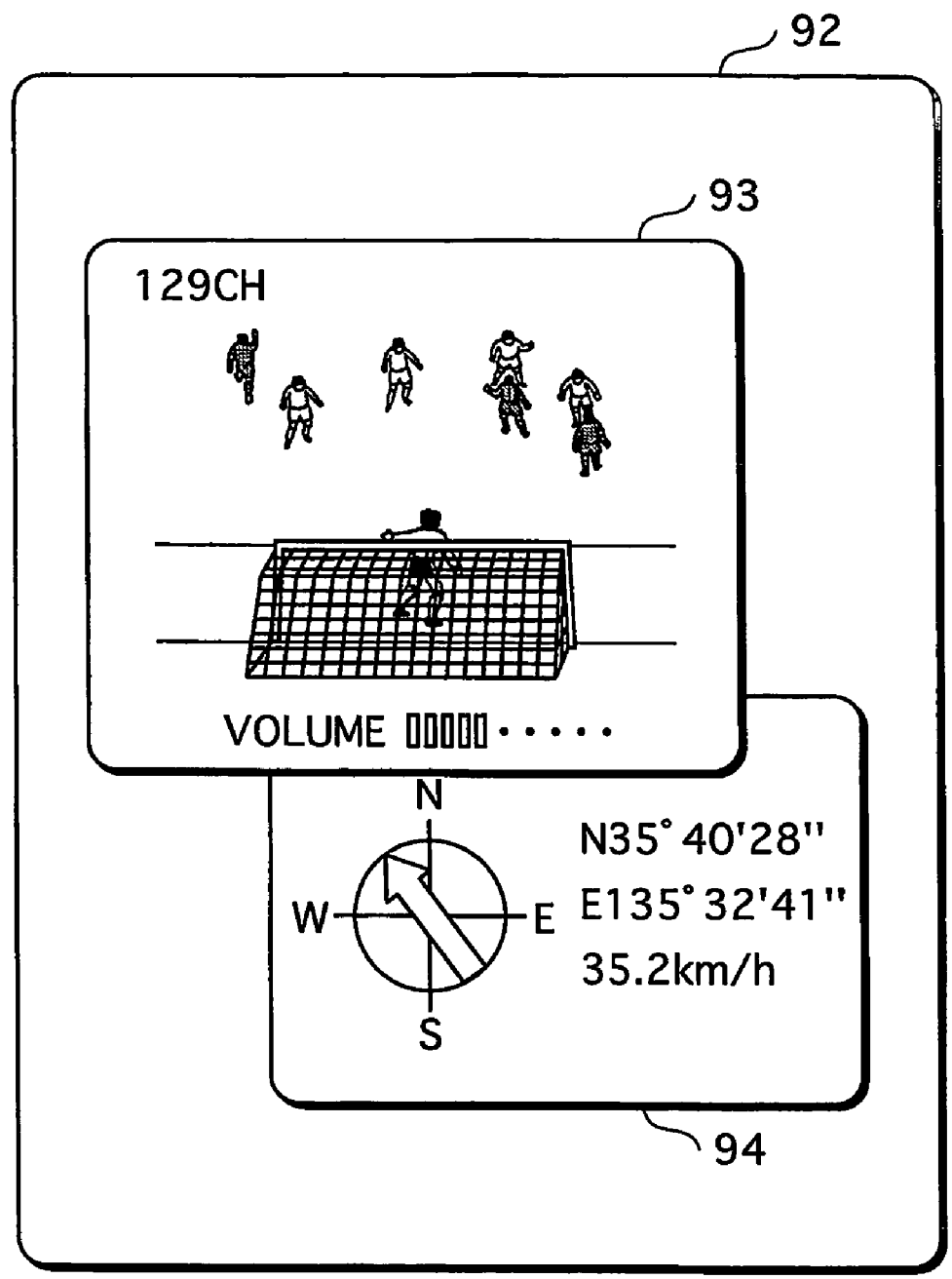
FIG. 2 shows one example of display on a display unit.

FIG. 2 shows one example of display on the display unit 92. The display unit 92 may be implemented using a display device capable of bitmap display, such as a liquid crystal display panel and an EL (Electro Luminescence) display panel. The display unit 92 displays predetermined information in multiple windows. In the example shown in the figure, the pictures of the selected program and the positional information are displayed in windows 93 and 94, respectively. The positional information displayed in the window 94 shows, as an example, the latitude and longitude as well as the moving speed and direction.

(Details of Main Part)

Figure 3:
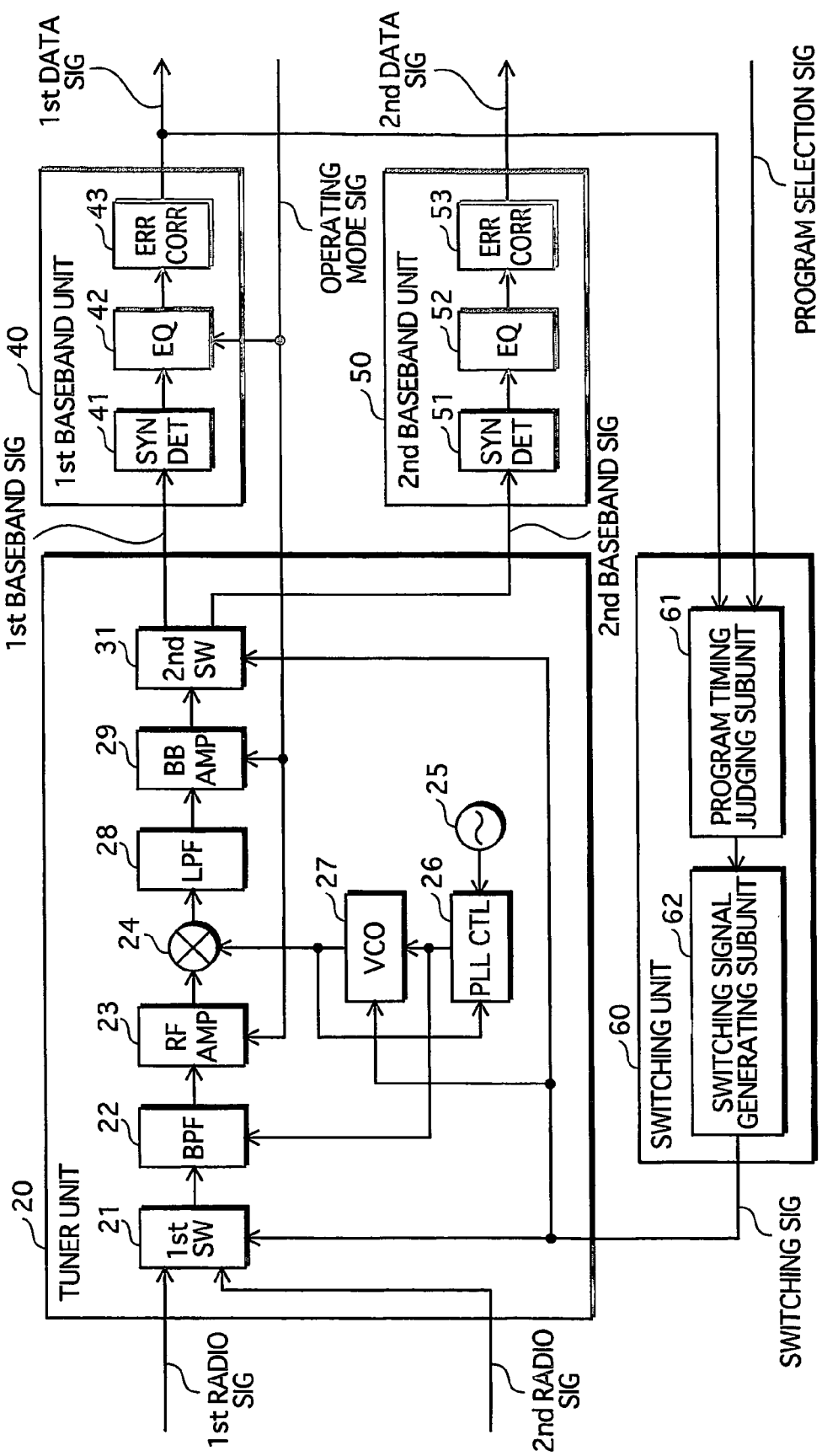
FIG. 3 is a functional block diagram showing the detailed structure of a main part of the wireless terminal device according to the embodiment 1.

FIG. 3 is a functional block diagram showing the detailed structure of the main part of the wireless terminal device.

In the tuner unit 20, a first switching circuit 21 outputs the first radio signal during the first period and the second radio signal during the second period, according to the switching signal. A variable bandpass filter 22 exclusively allows the first radio signal to pass during the first period, and the second radio signal to pass during the second period, according to an outputs signal of a PLL control unit 26. An RF amplifier circuit 23 amplifies an outputs signal of the variable bandpass filter 22.

A voltage control oscillator 27 generates a local signal at a first frequency during the first period and at a second frequency during the second period, according to the switching signal. The local signal of the first frequency is used to modulate the first baseband signal to a predetermined frequency range, whereas the local signal of the second frequency is used to modulate the second baseband signal also to the predetermined frequency range. The PLL control unit 26 performs PLL (Phase Locked Loop) control on the oscillation frequency of the voltage control oscillator 27 based on a reference frequency generated by a reference oscillator 25.

A frequency converter 24 converts an output signal of the RF amplifier circuit 23 to a baseband signal using the local signal generated by the voltage control oscillator 27. A lowpass filter 28 removes all frequency components outside the predetermined frequency range from an output signal of the frequency converter 24. A baseband amplifier circuit 29 amplifies an output signal of the lowpass filter 28. A second switching circuit 31 passes the output signal of the baseband amplifier circuit 29 to the first baseband unit 40 during the first period, and to the second baseband unit 50 during the second period, according to the switching signal.

In the first baseband unit 40, a synchronization detector 41 detects a synchronization symbol from the first baseband signal. An equalizer 42 corrects, based on the detected synchronization symbol, a rotation of the phase and an attenuation of the amplitude caused to the first baseband signal due to the characteristics of a transmission path. An error corrector 43 decodes the equalized first baseband signal to a first data signal using an error-correcting decoding scheme, such as maximum likelihood decoding.

The second baseband unit 50 is similar to the first baseband unit 40 in structure.

In the switching unit 60, a program timing judging subunit 61 identifies the periods during which the first radio signal represents the selected program, and a switching signal generating subunit 62 generates a switching signal indicative of first periods, each of which includes one of the identified periods.

Among the above components constituting the main part of the wireless terminal device, the RF amplifier circuit 23, the baseband amplifier circuit 29, and the equalizer 42 maybe variable in their operating characteristics depending on whether the operating mode signal indicates the mobile reception mode or the fixed reception mode. To be more specific, the RF amplifier circuit 23 and the baseband amplifier circuit 29 may increase the speed of tracking the AGC adjustments in the mobile reception mode than in fixed reception mode. Similarly, the equalizer 42 may increase the speed of tracking the correction amount to the first baseband signal in the mobile reception mode than in the fixed reception mode. This arrangement lessens the influence of the abrupt fading that often occurs during the mobile reception.

(Example of Contents of First Radio Signal)

Described below is given to one example of the contents of the first radio signal shown in the upper row of FIG. 4. In this example, four programs are time-division multiplexed into the first radio signal. The audio and video data of each program are represented in time slices that are repeatedly assigned to the program. The first radio signal includes information indicative of the lengths of time slices assigned to each program. For example, the information indicates the number of programs multiplexed in the signal, the lengths of time slices, and a starting time of a next time slice for each program. The information may be multiplexed in the first radio signal together with a corresponding program. Alternatively, in the case where the number of programs multiplexed and the lengths of time slices assigned are known in advance, the information may simply be synchronization information indicating boundaries between time slices.

(Operations)

Hereinafter, description is given to the operations of the wireless terminal device.

In the initial state, the switching signal is fixed to control the tuner unit 20 to demodulate the first radio signal at all times. The first data signal obtained in the initial state represents the programs that are substantially identical to the ones shown in the upper row of the FIG. 4, except that there is a slight delay due to demodulation processing.

Having identified what programs are time-division multiplexed into the first radio signal, the control unit 85 receives, via the input unit 95, a user input selecting one of the programs to be reproduced, and outputs a program selection signal indicative of the selected program to the program timing judging subunit 61. The program timing judging subunit 61 identifies periods during which the first radio signal represents the selected program, with reference to the information included in the first data signal that indicates the time slices assigned to the selected program. Then, the switching signal generating subunit 62 starts to output a switching signal indicating first periods, each of which includes one of the identified periods.

Each first period may be determined by adding, before and after a corresponding one of the identified periods, time periods taken for the tuner unit 20 to stabilize and to demodulate the first radio signal, respectively.

Figure 4:
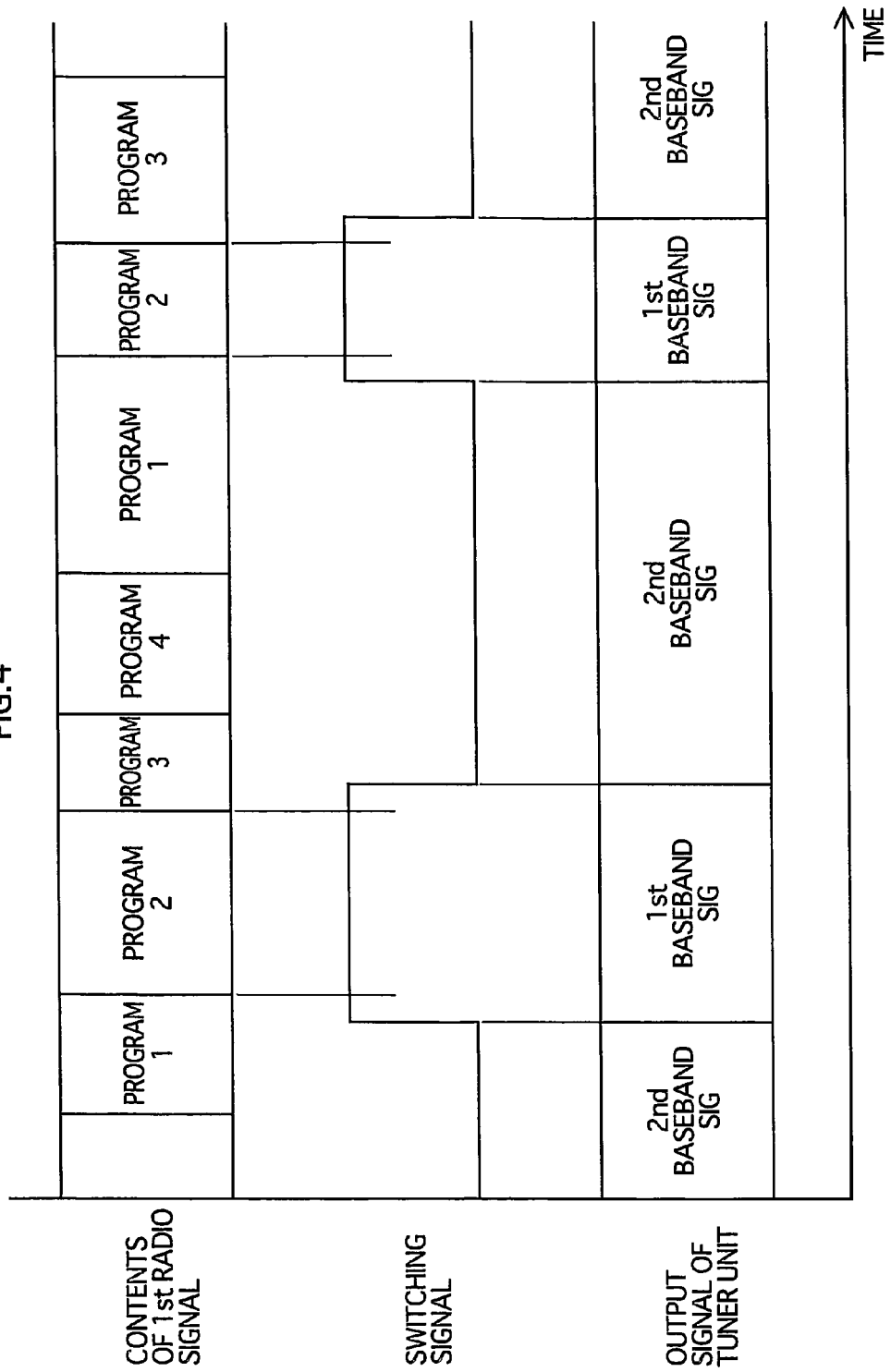
FIG. 4 is a timing chart showing a first radio signal received, a switching signal, and an output of a tuner unit.

In FIG. 4, the middle row shows an example of the switching signal in the case where the program 2 is selected.

Once output of the switching signal begins, the tuner unit 20 processes the first and second radio signals by time-sharing operation. To be more specific, during the first period, the tuner unit 20 outputs the first baseband signal that is obtained by frequency converting the first radio signal, and during the second period, outputs the second baseband signal that is obtained by frequency converting the second radio signal.

In FIG. 4, the lower row shows one example of the contents of an output signal of the tuner unit 20.

The switching signal generating subunit 62 may supply the switching signal not only to the tuner unit 20 but also to the first baseband unit 40 and the second baseband unit 50. This allows the first baseband unit 40 and the second baseband unit 50 to operate only during the first period and the second period, respectively. Alternatively, the first baseband unit 40 and the second baseband unit 50 may be so structured to automatically stop operating while receiving no baseband signal.

Furthermore, the switching signal generating subunit 62 may control the switching of operations of the first switching circuit 21, the voltage control oscillator 27, and the second switching circuit 31 by supplying different switching signals indicating optimum switching timings that compensate delays of the respective signals.

(Reception of First Radio Signal Transmitted in Cellular System)

In the case where the first service is provided by a cellular system in which a base station located in each of a plurality of geographic cells transmits the respective first radio signal. In this case, the wireless terminal device may switch cells for receiving the first radio signal based on the positional data obtained from the second radio signal.

To this end, for example, the control unit 85 pre-stores information showing each cell's service area and transmission frequency of the first radio signal (note that the information is not illustrated). When the current position shown by the positional data moves from the service area of a first cell to the service area of a second cell, the wireless terminal device changes the frequency at which the local signal is generated during the first period. As a result, the wireless terminal device stops receiving the first radio signal from the base station of the first cell, and starts receiving the first radio signal from the base station of the second cell.

Figure 5:
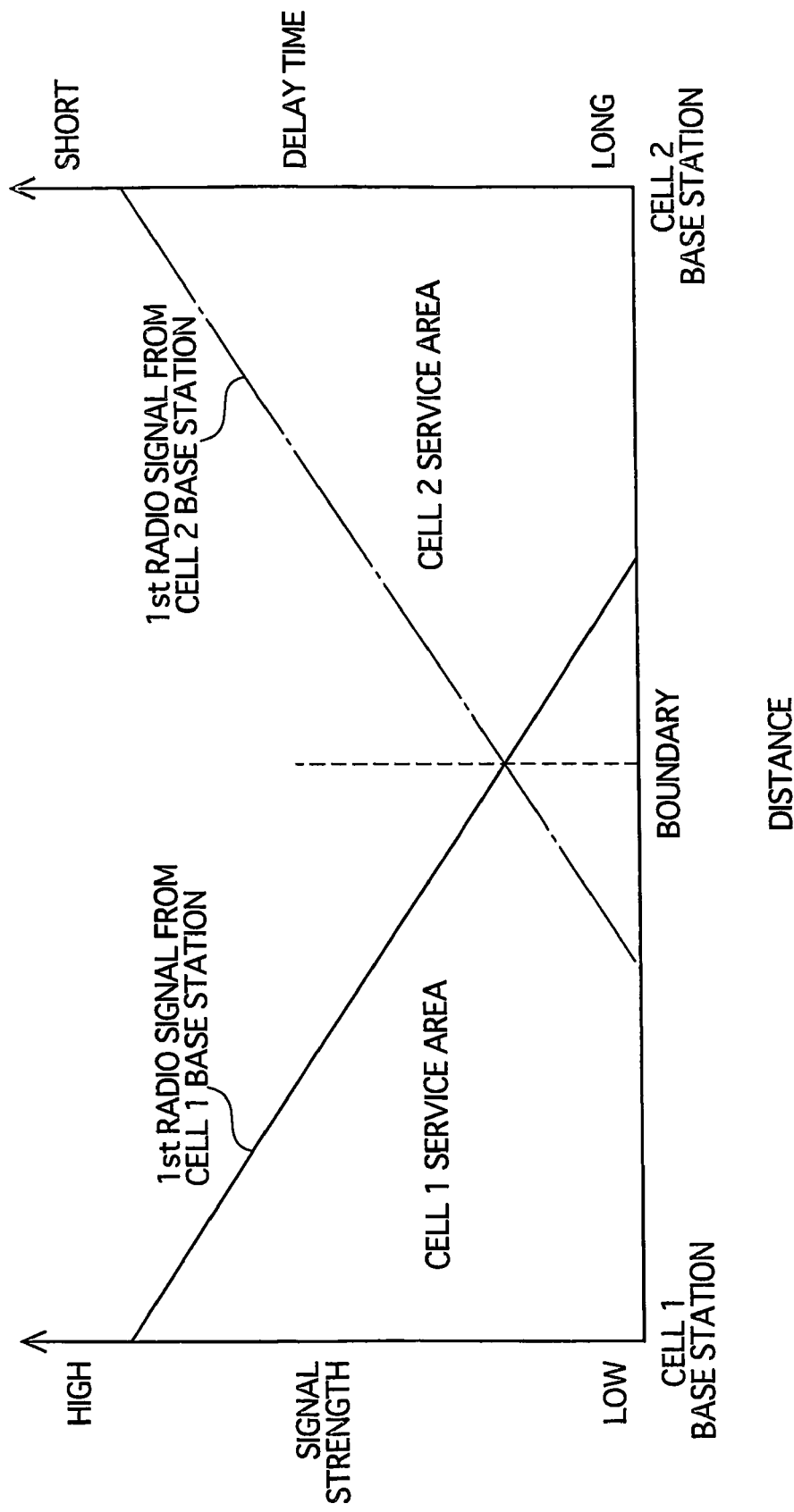
FIG. 5 is a graph of changes in the signal strength and delay time of two first radio signals transmitted from the respective base stations of neighboring cells.

FIG. 5 is a graph of changes in the signal strength and delay time of two first radio signals transmitted from the respective base stations of neighboring cells. As shown in the figure, there is a point at which the signal strengths and delay times of the two first radio signals are substantially equal. This point is determined to correspond to the boundary between the cells. By switching the cells for the first radio signal reception at the time when the current position moves across such a boundary, the first radio signal is received in the new cell without redoing adjustment of AGC and reception of a synchronization signal for estimating an effective symbol period. This minimizes the possibility that sounds and images are interrupted when the wireless terminal device moves across the boundary of cells.

(First Recapitulation)

According to the structure of the present embodiment, through time-sharing operation, the tuner unit 20 is commonly used to receive the first and second radio signals during the first and second periods, respectively. Accordingly, the tuner unit 20 may be implemented using a single local oscillator. This structure ensures that two different local signals are never generated concurrently, and thus eliminates the possibility of harmful interference. This structure further helps to reduce the device size (the occupied area when implemented on an IC chip) and the power consumption.

Note that a single antenna may be commonly used as both the first antenna 11 and the second antenna 12.

Further, it may be applicable to additionally provide a power-saving control unit (not illustrated) that stops or restricts supply of the operating power or operating clock signal to the second baseband unit during the first period and to the first baseband unit during the second period. The power-saving control unit minimizes the power wasted by each component for performing no useful operations.

Embodiment 2

An embodiment 2 differs from the embodiment 1 in that a wireless terminal device of the present embodiment is adapted for the second service which is a bidirectional communication service as well as for the first service mentioned above.

Examples of the second service that the wireless terminal device of the present embodiment handles include a wireless Internet access service (of which access points are known as hotspots), a wireless LAN (Local Area Network), and remote control of home appliances. Further, examples of information that is displayed relating to the second service along with the selected program include a Website, another program that is broadcast via the Internet separately from the program of the first service, the states of the home appliances controlled.

Hereinafter, description is given mainly to the differences from the embodiment 1.

(Overall Structure)

Figure 6:
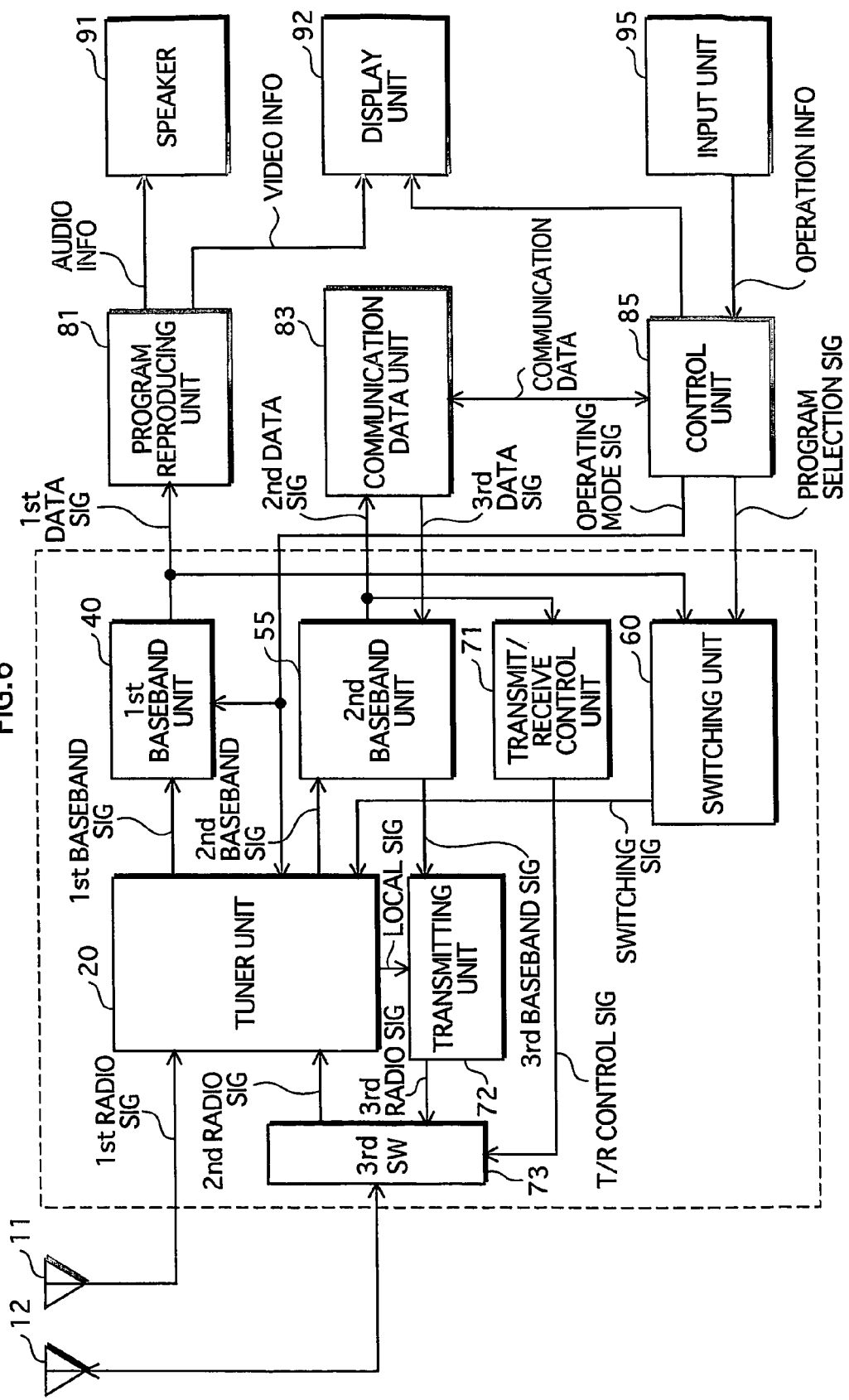
FIG. 6 is a functional block diagram showing the overall structure of a wireless terminal device according to an embodiment 2.

FIG. 6 is a functional block diagram showing the overall structure of a wireless terminal device according to the embodiment 2. The same components as those in the embodiment 1 are denoted by the same references.

Different from the wireless terminal device of the embodiment 1, the wireless terminal device of the present embodiment includes a communication data unit 83 instead of the current position measuring unit 82, a second baseband unit 55 that has been altered from the second baseband unit 50, and additional components of a transmit/receive control unit 71, a transmitting unit 72, and a third switching circuit 73.

The communication data unit 83 extracts reception communication data from the second data signal, and outputs the extracted data to the control unit 85. In addition, the communication data unit 83 composes a third data signal from transmission communication data that is supplied from the control unit 85, and outputs the third data signal to the second baseband unit 55. The extracting and composing of data may be carried out in compliance with IPs (Internet Protocol), for example.

For the convenience sake, description hereinafter is given to the case where bidirectional communication is performed using a TDD (Time-Division Duplex) scheme.

The transmit/receive control unit 71 outputs a T/R (transmit/receive) control signal indicating reception periods and transmission periods of the bidirectional communication.

During the reception periods, the second baseband unit 55 modulates the second baseband signal to the second data signal, similarly to the second baseband unit 50 of the embodiment 1. During the transmission periods, the second baseband unit 55 modulates the third data signal to a third baseband signal. The transmitting unit 72 frequency converts the third baseband signal to a third radio signal using a local signal generated by the voltage control oscillator 27 (see FIG. 3) in the tuner unit 20. The third switching circuit 73 passes the second radio signal that is received with the second antenna 12 to the tuner unit 20 during the reception periods, and passes the third radio signal that is outputted from the transmitting unit 72 to the second antenna 12 during the transmission periods, according to the T/R control signal.

The voltage control oscillator 27 may operate in compliance with the T/R control signal as well as with the switching signal described in the embodiment 1, to generate the local signal selectively at one of three frequencies: a frequency for reception of the first radio signal; a frequency for reception of the second radio signal, and a frequency for transmission of the third radio signal.

(Second Recapitulation)

According to the present embodiment, through time-sharing operation, the tuner unit 20 is commonly used for receiving the first and second radio signals during the first and second periods, respectively. Accordingly, the tuner unit 20 may be implemented using a single local oscillator. Further, the local oscillator is also used for transmitting the third radio signal. This structure ensures that two different local signals are never generated concurrently, and thus eliminates the possibility of harmful interference. This structure further helps to reduce the device size (the occupied area when implemented on an IC chip) as well as the power consumption.

Note that in the case where the second radio signal allows the wireless terminal device to obtain positional information relative to access points, the modes and cells for the first radio signal reception may be switched based on the positional information in a similar manner to the embodiment 1.

Embodiment 3

A wireless terminal device of an embodiment 3 is different from that of the embodiment 1 in the detailed structure of the tuner unit 20.

Hereinafter, description is given mainly to the difference from the embodiment 1.

(Detailed Structure of Main Part)

Figure 7:
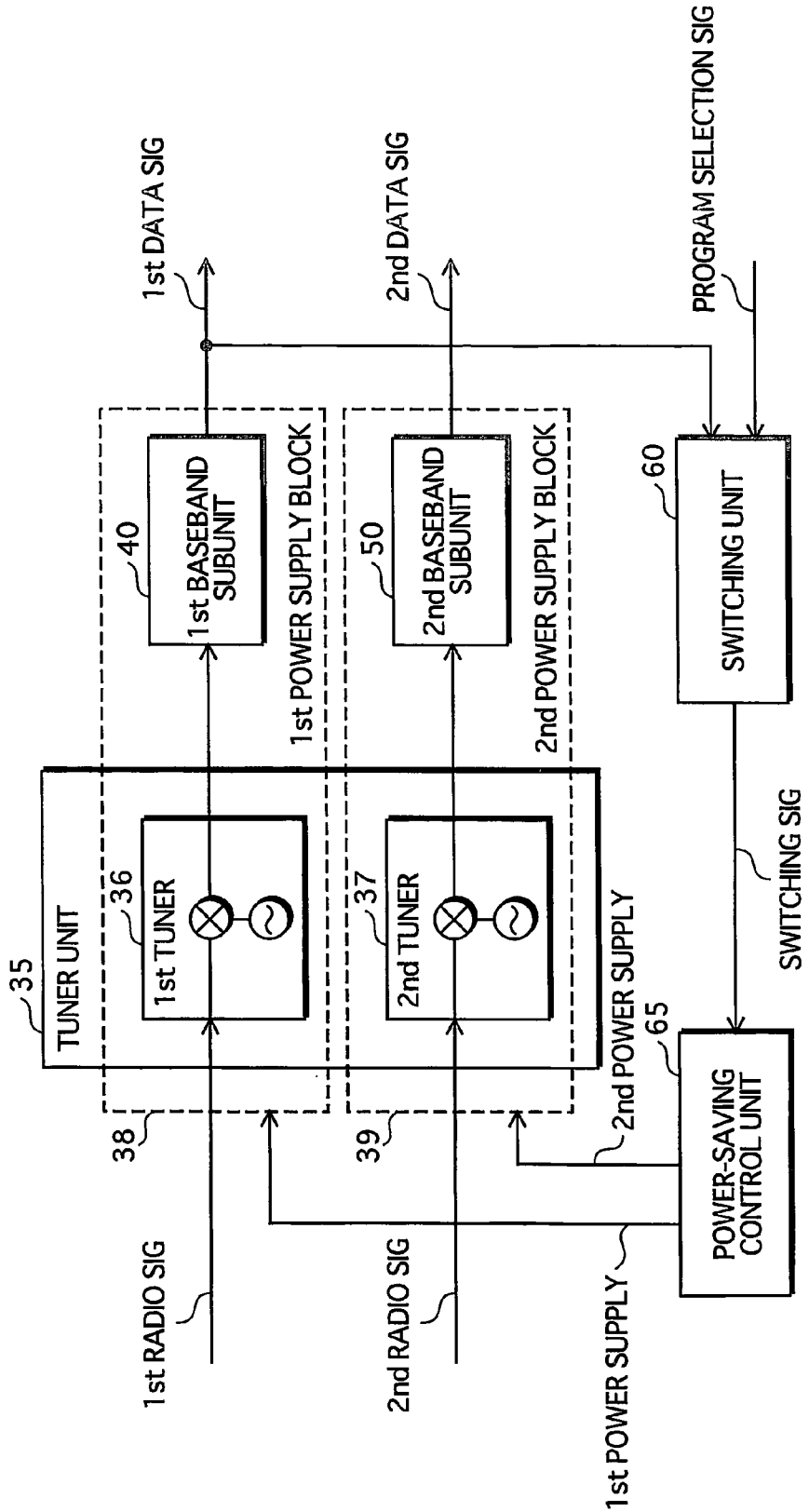
FIG. 7 is a functional block diagram showing the detailed structure of a main part of a wireless terminal device according to an embodiment 3.
Figure 8:
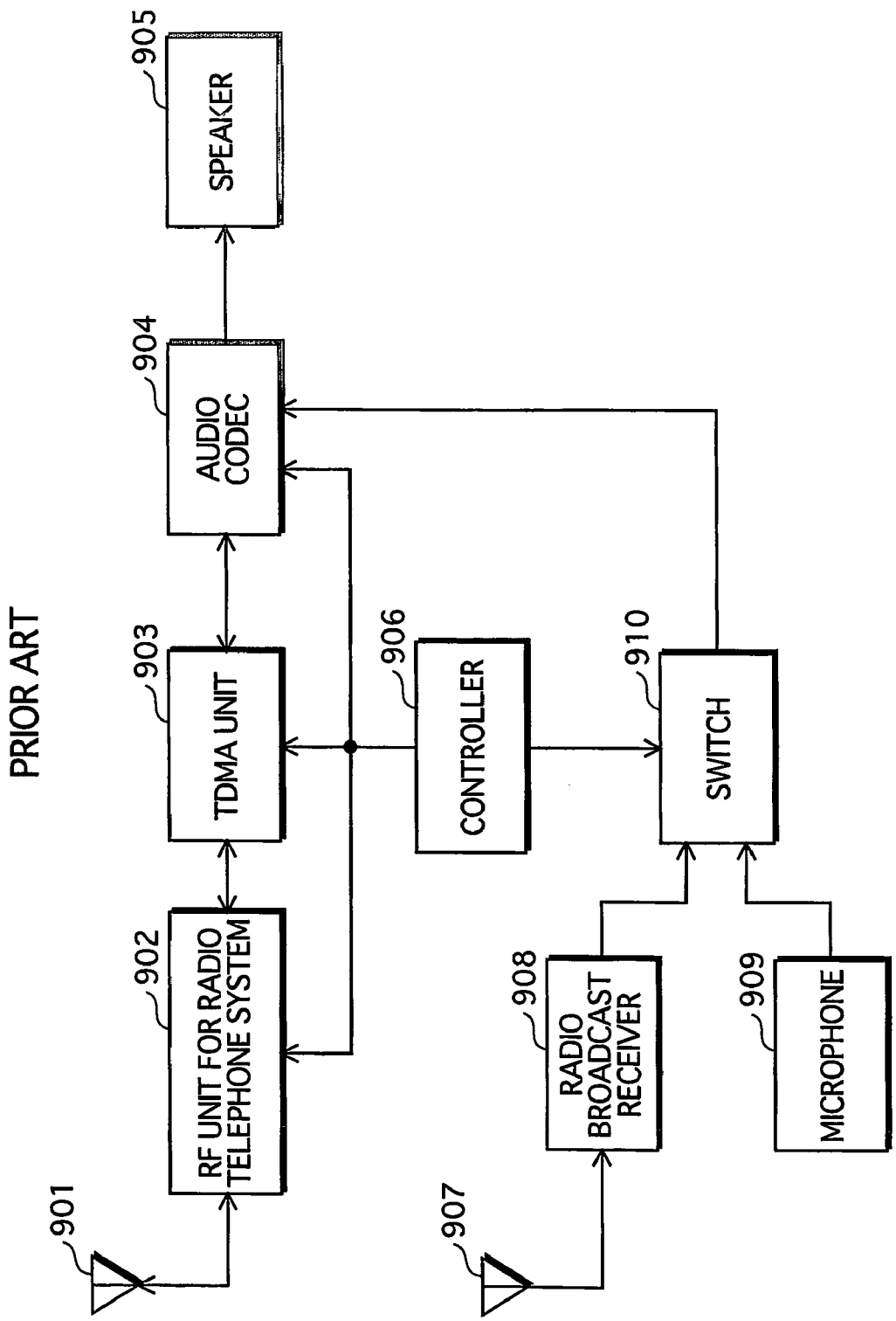
FIG. 8 is a functional block diagram showing the overall structure of a wireless communication device according to prior art.

FIG. 7 is a functional block diagram showing the detailed structure of a main part of the wireless terminal device according to the embodiment 3. Different from the main part of the embodiment 1, the main part of the present embodiment includes a tuner unit 35 that is composed of two circuitry blocks of a first tuner 36 and a second tuner 37. Further, a power-saving control unit 65 is additionally included for controlling power supply.

The first tuner 36 and the second tuner 37 are separately provided with a local oscillator and a frequency converter. The first tuner 36 frequency converts the first radio signal to the first baseband signal, and the second tuner 37 frequency converts the second radio signal to the second baseband signal.

The first tuner 36 and the first baseband unit 40 are included in a first power supply block that operates with a first power supply. The second tuner 37 and the second baseband unit 50 are included in a second power supply block that operates with a second power supply.

The power-saving control unit 65 supplies the first power only during the first period, and the second power only during the second period, according to the switching signal.

(Third Recapitulation)

According to the present embodiment, the first tuner 36 and the second tuner 37 never operate concurrently, and thus two different local signals are never generated concurrently. Consequently, the possibility of harmful interference is eliminated and the power consumption of the wireless terminal device is reduced.

Industrial Applicability

A wireless terminal device of the present invention is applicable to a device that receives (i) a broadcast signal in which a plurality of programs are time-division multiplexed, to reproduce a user-selected program, as well as (ii) a radio signal that is different from the broadcast signal, to conduct a predetermined processing. Examples of such a device include a portable television receiver, a notebook PC, a mobile phone, and a PDA.

The invention claimed is:

1. A wireless terminal device for (i) receiving a first radio signal relating to a first service which is a broadcasting service, and a second radio signal relating to a bidirectional communication service, the first radio signal representing a plurality of time-division multiplexed programs as well as periods during which the respective programs are represented, and (ii) performing reproduction of one of the programs selected by a user, and predetermined processing based on the second radio signal, the wireless terminal device comprising:

a tuner unit operable to generate a first baseband signal and a second baseband signal one at a time according to a switching signal, the first baseband signal being generated by frequency converting the received first radio signal and the second baseband signal being generated by frequency converting the received second radio signal;

a first baseband unit operable to demodulate the first baseband signal to a first data signal;

a second baseband unit operable to demodulate the second baseband signal to a second data signal, and modulate a third data signal to a third baseband signal, the third data signal being transmission data relating to the bidirectional communication service;

a switching unit operable to identify, with reference to the first data signal, a period during which the first radio signal representing the selected program is received, and control the tuner unit by outputting thereto the switching signal indicating a first period that includes the identified period, so that the tuner unit generates the first baseband signal during the first period and the second baseband signal during a second period that is a period other than the first period;

a local oscillator operable to generate, according to the switching signal, a local signal at (i) a first frequency during the first period for use in the generation of the first baseband signal, (ii) a second frequency during the second period for use in the generation of the second baseband signal, and (iii) a third frequency during a transmission period of the bidirectional communication; and a transmitting unit operable to generate a third radio signal by frequency converting the third baseband signal using the local signal of the third frequency, and transmit the third radio signal, wherein the tuner unit generates, using the local signal, the first and second baseband signals by frequency converting the first and second radio signals, respectively, and the wireless terminal device reproduces the selected program from the first data signal, and conducts the predetermined processing using the second data signal.

2. The wireless terminal device of claim 1, wherein the tuner unit includes:
a first tuner operable to generate a first local signal exclusively during the first period according to the switching signal, and generate the first baseband signal by frequency converting the first radio signal using the first local signal; and
a second tuner operable to generate a second local signal exclusively during the second period according to the switching signal, and generate the second baseband signal by frequency converting the second radio signal using the second local signal.

3. The wireless terminal device of claim 2, further comprising:
a power-saving unit operable to restrict or stop supply of operating power to (i) the second tuner during the first period and (ii) the first tuner during the second period, according to the switching signal.

4. The wireless terminal device of claim 1, further comprising:
a power-saving unit operable to restrict or stop supply of operating power or an operating clock signal to (i) the second baseband unit during the first period, and (ii) the first baseband unit during the second period, according to the switching signal.

5. The wireless terminal device of claim 1, further comprising:
a first antenna having a selective gain to the first radio signal, and operable to output a received signal to the tuner unit; and
a second antenna having a selective gain to the second radio signal, and operable to output a received signal to the tuner unit, wherein
the tuner unit includes a switching subunit operable to select one of the signal received by the first antenna during the first period and the signal received by the second antenna during the second period, according to the switching signal, and
the tuner unit generates the first baseband signal and the second baseband signal both by frequency converting the signal selected by the switching subunit.

6. The wireless terminal of claim 1, wherein
the tuner unit includes a variable bandpass filter operable to exclusively pass, according to the switching signal, the first radio signal during the first period and the second radio signal during the second period, out of a reception signal containing the first and the second radio signals, wherein
the tuner unit generates the first baseband signal and the second baseband signal both by frequency converting an output signal of the variable bandpass filter.

7. The wireless terminal of claim 1, wherein
the first service is provided by a cellular system in which each of a plurality of base stations provided for a geographic cell transmits the respective first radio signal, and the second radio signal contains positional information for measuring a current position of a receiver device of the second radio signal, and
the wireless terminal device periodically measures its own current position based on the received second radio signal, and when the measured current position moves from a first cell into a second cell, the wireless terminal device stops receiving the first radio signal transmitted from a base station of the first cell and commences receiving the first radio signal transmitted from a base station of the second cell.

8. The wireless terminal device of claim 1, wherein
the second radio signal contains positional information for measuring a current position of a receiver device of the second radio signal, and
the wireless terminal device periodically measures its own current position based on the received second radio signal to calculate a moving speed, and receives the first radio signal in one of a plurality of different operating modes that corresponds to the calculated moving speed.

9. The wireless terminal device of claim 1 displays information relating to the predetermined processing according to the second radio signal, on a display along with the selected program.

10. The wireless terminal device of claim 1, wherein
the first service is Digital Video Broadcasting or Digital Audio Broadcasting in Europe.

11. The wireless terminal device of claim 1, wherein
the second service is a wireless Local Area Network, a mobile phone, a Global Positioning System, or remote control of a device.

12. A single-chip IC or an IC chip set for use in a wireless terminal device, the wireless terminal device (i) receiving a first radio signal relating to a first service which is a broadcasting service, and a second radio signal relating to a bidirectional communication service, the first radio signal representing a plurality of time-division multiplexed programs as well as periods during which the respective programs are represented, and (ii) performing reproduction of one of the programs selected by a user, and predetermined processing based on the second radio signal, the single-chip IC or the IC chip set comprising:
a reception signal obtaining terminal operable to obtain the first and second radio signals received;
a tuner circuit operable to generate a first baseband signal and a second baseband signal one at a time according to a switching signal, the first baseband signal being generated by frequency converting the obtained first radio signal and the second baseband signal being generated by frequency converting the obtained second radio signal;
a first baseband circuit operable to demodulate the first baseband signal to a first data signal;
a second baseband circuit operable to demodulate the second baseband signal to a second data signal, and modulate a third data signal to a third baseband signal, the third data signal being transmission data relating to the bidirectional communication service;
a program selection signal obtaining terminal operable to obtain a signal indicating the selected program;
a switching circuit operable to identify, with reference to the first data signal, a period during which the first radio signal representing the selected program is received, and control the tuner circuit by outputting thereto the switching signal indicating a first period that includes the identified period, so that the tuner circuit generates the first baseband signal during the first period and the second baseband signal during a second period that is a period other than the first period;
a local oscillator operable to generate, according to the switching signal at (i) a first frequency during the first period for use in the generation of the first baseband signal, (ii) a second frequency during the second period for use in the generation of the second baseband signal, and (iii) a third frequency during a transmission period of the bidirectional communication; and a transmitting unit operable to generate a third radio signal by frequency converting the third baseband signal using the local signal of the third frequency, and transmit the third radio signal, wherein the tuner unit generates, using the local signal, the first and second baseband signals by frequency converting the first and second radio signals, respectively, and an output terminal operable to output the first and second data signals.

13. The single-chip IC or the IC chip set of claim 12, wherein the tuner circuit includes:

a first tuner operable to generate a first local signal exclusively during the first period according to the switching signal, and generate the first baseband signal by frequency converting the first radio signal using the first local signal; and a second tuner operable to generate a second local signal exclusively during the second period according to the switching signal, and generate the second baseband signal by frequency converting the second radio signal using the second local signal.

14. A wireless terminal device for (i) receiving a first radio signal relating to a first service which is a broadcasting service, and a second radio signal relating to a bidirectional communication service, the first radio signal representing a plurality of time-division multiplexed programs as well as periods during which the respective programs are represented, and (ii) performing reproduction of one of the programs selected by a user, and predetermined processing based on the second radio signal, the wireless terminal device comprising:

a tuner unit operable to generate a first baseband signal and a second baseband signal one at a time according to a switching signal, the first baseband signal being generated by frequency converting the received first radio signal and the second baseband signal being generated by frequency converting the received second radio signal;

a first baseband unit operable to demodulate the first baseband signal to a first data signal;

a second baseband unit operable to demodulate the second baseband signal to a second data signal, and modulate a third data signal to a third baseband signal, the third data signal being transmission data relating to the bidirectional communication service;

a switching unit operable to identify, with reference to the first data signal, a period during which the first radio signal representing the selected program is received, and control the tuner unit by outputting thereto the switching signal indicating a first period that includes the identified period, so that the tuner unit generates the first baseband signal during the first period and the second baseband signal during a second period that is a period other than the first period, wherein the tuner unit includes a single local oscillator configured to generate according to the switching signal, a local signal at (i) a first frequency during the first period for use in the generation of the first baseband signal, (ii) a second frequency during the second period for use in the generation of the second baseband signal, and (iii) a third frequency during a transmission period of the bidirectional communication; and a transmitting unit operable to generate a third radio signal by frequency converting the third baseband signal using the local signal of the third frequency, and transmit the third radio signal, wherein the tuner unit generates, using the local signal, the first and second baseband signals by frequency converting the first and second radio signals, respectively, and;

the wireless terminal device reproduces the selected program from the first data signal, and conducts the predetermined processing using the second data signal.

15. The wireless terminal device of claim 14, wherein the tuner unit includes:

a first tuner operable to generate a first local signal exclusively during the first period according to the switching signal, and generate the first baseband signal by frequency converting the first radio signal using the first local signal; and a second tuner operable to generate a second local signal exclusively during the second period according to the switching signal, and generate the second baseband signal by frequency converting the second radio signal using the second local signal.

16. The wireless terminal device of claim 14, further comprising:

a power-saving unit operable to restrict or stop supply of operating power to (i) the second tuner during the first period and (ii) the first tuner during the second period, according to the switching signal.

17. The wireless terminal device of claim 14, further comprising:

a power-saving unit operable to restrict or stop supply of operating power or an operating clock signal to (i) the second baseband unit during the first period, and (ii) the first baseband unit during the second period, according to the switching signal.

* * * * *